United States Patent
Fang et al.

(10) Patent No.: US 7,671,401 B2
(45) Date of Patent: Mar. 2, 2010

(54) NON-VOLATILE MEMORY IN CMOS LOGIC PROCESS

(75) Inventors: Gang-feng Fang, Alameda, CA (US); Dennis Sinitsky, Los Gatos, CA (US); Wingyu Leung, Cupertino, CA (US)

(73) Assignee: Mosys, Inc., Sunnyvale, CA (US)

( * ) Notice: Subject to any disclaimer, the term of this patent is extended or adjusted under 35 U.S.C. 154(b) by 253 days.

(21) Appl. No.: 11/262,141

(22) Filed: Oct. 28, 2005

(65) Prior Publication Data
US 2007/0097743 A1   May 3, 2007

(51) Int. Cl.
H01L 29/788 (2006.01)
(52) U.S. Cl. .................. 257/318; 257/321; 257/322; 257/E29.303; 257/E29.304
(58) Field of Classification Search .................. 257/318, 257/E29.3, 316, 321, 322, E29.302, E29.303, 257/E29.304
See application file for complete search history.

(56) References Cited

U.S. PATENT DOCUMENTS

| | | | | |
|---|---|---|---|---|
| 6,166,954 A * | 12/2000 | Chern | ................ | 365/185.14 |
| 6,191,980 B1 * | 2/2001 | Kelley et al. | ........... | 365/185.29 |
| 6,314,023 B1 * | 11/2001 | Waldo | ................ | 365/185.09 |
| 6,324,095 B1 * | 11/2001 | McPartland et al. | .... | 365/185.05 |
| 6,407,425 B1 * | 6/2002 | Babcock et al. | ............. | 257/318 |
| 6,459,615 B1 * | 10/2002 | McPartland et al. | ...... | 365/185.1 |
| 6,552,931 B2 * | 4/2003 | McPartland et al. | .... | 365/185.05 |
| 6,614,684 B1 * | 9/2003 | Shukuri et al. | ......... | 365/185.05 |
| 6,631,087 B2 * | 10/2003 | Di Pede et al. | ......... | 365/185.18 |
| 6,661,705 B1 * | 12/2003 | McPartland et al. | .... | 365/185.05 |
| 6,788,574 B1 | 9/2004 | Han et al. | | |
| 7,177,182 B2 | 3/2007 | Diorio et al. | | |
| 7,285,817 B2 * | 10/2007 | Maemura et al. | ............. | 257/315 |
| 7,391,647 B2 * | 6/2008 | Fang et al. | ............. | 365/185.18 |
| 7,531,864 B2 * | 5/2009 | Maemura et al. | ............. | 257/314 |
| 2001/0025980 A1 * | 10/2001 | Bottini et al. | ................ | 257/315 |
| 2005/0275009 A1 * | 12/2005 | Maemura et al. | ............. | 257/314 |
| 2008/0012141 A1 * | 1/2008 | Maemura et al. | ............. | 257/758 |

OTHER PUBLICATIONS

Shi et al. "Polarity Dependent Gate Tunneling Currents in Dual-Gate CMOSFET's", IEEE Transactions on Electron Devices, vol. 45, No. 11, Nov. 1998, pp. 2355-2360.
Ohsaki et al. "A Single Poly EEPROM Cell Structure for Use in Standard CMOS Processes", IEEE Journal of Solid-State Circuits, vol. 29, No. 3, Mar. 1994, pp. 311-316.

* cited by examiner

*Primary Examiner*—Anh Phung
*Assistant Examiner*—Michael Lulis
(74) *Attorney, Agent, or Firm*—E. Eric Hoffman

(57) ABSTRACT

A method, apparatus, and system in which an embedded memory fabricated in accordance with a conventional logic process includes one or more electrically-alterable non-volatile memory cells, each having a programming transistor, a read transistor and a control capacitor, which share a common floating gate electrode. The under-diffusion of the source/drain regions of the programming transistor and control capacitor are maximized. In one embodiment, the source/drain regions of the programming transistor are electrically shored by transistor punch-through (or direct contact).

20 Claims, 18 Drawing Sheets

| PROGRAM MODE (PROGRAM CELL 200) | |
|---|---|
| TERMINAL | APPLIED VOLTAGE |
| WL0 | -5 VOLTS |
| WL1 | 0 VOLTS |
| BL0 | 0 VOLTS |
| BL0' | 0 VOLTS |
| BL1 | 0 VOLTS |
| BL1' | 0 VOLTS |
| P0 | 5 VOLTS |
| P1 | 0 VOLTS |
| N-WELL 202, 302 | 0 VOLTS |
| P-SUB | 0 VOLTS |

FIG. 5A

| ERASE MODE (ALL CELLS) | |
|---|---|
| TERMINAL | APPLIED VOLTAGE |
| WL0 | 10 VOLTS |
| WL1 | 10 VOLTS |
| BL0 | 10 VOLTS |
| BL0' | 10 VOLTS |
| BL1 | 10 VOLTS |
| BL1' | 10 VOLTS |
| P0 | 0 VOLTS |
| P1 | 0 VOLTS |
| N-WELL 202, 302 | 10 VOLTS |
| P-SUB | 0 VOLTS |

FIG. 5B

| READ MODE (READ CELLS 200 & 300) | |
| --- | --- |
| TERMINAL | APPLIED VOLTAGE |
| WL0 | 0 VOLTS |
| WL1 | 0 VOLTS |
| BL0 | 0 VOLTS |
| BL0' | 1.2 VOLTS |
| BL1 | 0 VOLTS |
| BL1' | 0 VOLTS OR FLOAT |
| P0 | 0 VOLTS |
| P1 | 0 VOLTS |
| N-WELL 202 | 1.2 VOLTS |
| N-WELL 302 | 0 VOLTS |
| P-SUB | 0 VOLTS |

FIG. 5C

| PROGRAM MODE (PROGRAM CELL 200) | |
|---|---|
| TERMINAL | APPLIED VOLTAGE |
| WL0 | 10 VOLTS |
| WL1 | 0 VOLTS |
| BL0 | 10 VOLTS or FLOAT |
| BL0' | 10 VOLTS or FLOAT |
| BL1 | 0 VOLTS or FLOAT |
| BL1' | 0 VOLTS or FLOAT |
| P0 | 0 VOLTS |
| P1 | 5 VOLTS |
| N-WELL 202 | 10 VOLTS |
| N-WELL 302 | 0 VOLTS |
| P-SUB | 0 VOLTS |

FIG. 6A

| ERASE MODE (ALL CELLS) | |
|---|---|
| TERMINAL | APPLIED VOLTAGE |
| WL0 | -5 VOLTS |
| WL1 | -5 VOLTS |
| BL0 | 0 VOLTS or FLOAT |
| BL0' | 0 VOLTS or FLOAT |
| BL1 | 0 VOLTS or FLOAT |
| BL1' | 0 VOLTS or FLOAT |
| P0 | 5 VOLTS |
| P1 | 5 VOLTS |
| N-WELL 202, 302 | 0 VOLTS |
| P-SUB | 0 VOLTS |

FIG. 6B

| ERASE MODE (ALL CELLS) | |
|---|---|
| TERMINAL | APPLIED VOLTAGE |
| WL0 | 0 VOLTS |
| WL1 | 0 VOLTS |
| BL0 | 0 OR FLOAT |
| BL0' | 0 OR FLOAT |
| BL1 | 0 OR FLOAT |
| BL1' | 0 OR FLOAT |
| P0 | 8 VOLTS |
| P1 | 8 VOLTS |
| N-WELL 202, 302 | 0 VOLTS |
| P-SUB | 0 VOLTS |

FIG. 9

| PROGRAM MODE (PROGRAM CELL 900) | |
|---|---|
| TERMINAL | APPLIED VOLTAGE |
| WL0 | -5 VOLTS |
| WL1 | 0 VOLTS |
| BL0 | 0 VOLTS OR FLOAT |
| BL1 | 0 VOLTS OR FLOAT |
| P0 | 5 VOLTS |
| P1 | 0 VOLTS |
| N-WELL 902, 1002 | 0 VOLTS |
| P-SUB | 0 VOLTS |

FIG. 12A

| ERASE MODE (ALL CELLS) | |
|---|---|
| TERMINAL | APPLIED VOLTAGE |
| WL0 | 10 VOLTS |
| WL1 | 10 VOLTS |
| BL0 | 10 VOLTS |
| BL1 | 10 VOLTS |
| P0 | 0 VOLTS |
| P1 | 0 VOLTS |
| N-WELL 902, 1002 | 10 VOLTS |
| P-SUB | 0 VOLTS |

FIG. 12B

| READ MODE (READ CELLS 900 & 1000) | |
|---|---|
| TERMINAL | APPLIED VOLTAGE |
| WL0 | 0 VOLTS |
| WL1 | FLOATING |
| BL0 | 1.2 VOLTS |
| BL1 | 1.2 VOLTS |
| P0 | 0 VOLTS OR FLOAT |
| P1 | 0 VOLTS OR FLOAT |
| N-WELL 902 | 1.2 VOLTS |
| N-WELL 1002 | FLOATING |
| P-SUB | 0 VOLTS |

| TERMINAL | PROGRAM MODE (PROGRAM CELL 900) APPLIED VOLTAGE |
|---|---|
| WL0 | 10 VOLTS |
| WL1 | 0 VOLTS |
| BL0 | 10 VOLTS OR FLOAT |
| BL1 | 0 VOLTS OR FLOAT |
| P0 | 0 VOLTS |
| P1 | 5 VOLTS |
| N-WELL 902 | 10 VOLTS |
| N-WELL 1002 | 0 VOLTS |
| P-SUB | 0 VOLTS |

| TERMINAL | ERASE MODE (ALL CELLS) APPLIED VOLTAGE |
|---|---|
| WL0 | -5 VOLTS |
| WL1 | -5 VOLTS |
| BL0 | 0 VOLTS OR FLOAT |
| BL1 | 0 VOLTS OR FLOAT |
| P0 | 5 VOLTS |
| P1 | 5 VOLTS |
| N-WELL 902, 1002 | 0 VOLTS |
| P-SUB | 0 VOLTS |

| ERASE MODE (ALL CELLS) | |
|---|---|
| TERMINAL | APPLIED VOLTAGE |
| WL0 | 0 VOLTS |
| WL1 | 0 VOLTS |
| BL0 | 0 VOLTS or FLOAT |
| BL1 | 0 VOLTS or FLOAT |
| P0 | 8 VOLTS |
| P1 | 8 VOLTS |
| N-WELL 902, 1002 | 0 VOLTS |
| P-SUB | 0 VOLTS |

FIG. 14

NON-VOLATILE MEMORY IN CMOS LOGIC PROCESS

FIELD OF THE INVENTION

The present invention relates to non-volatile memory (NVM). More particularly, this invention relates to non-volatile memory cells fabricated using an application specific integrated circuit (ASIC) or a conventional logic process. In the present application, a conventional logic process is defined as a semiconductor process that implements single-well, twin-well or triple-well technology, and which includes a single layer of conductive gate material. The present invention further relates to a method of operating a non-volatile memory to ensure maximum data retention time.

BACKGROUND OF INVENTION

For system-on-chip (SOC) applications, it is desirable to integrate many functional blocks into a single integrated circuit. The most commonly used blocks include a microprocessor or micro-controller, static random access memory (SRAM) blocks, non-volatile memory blocks, and various special function logic blocks. However, traditional non-volatile memory processes, which typically use stacked gate or split-gate memory cells, are not compatible with a conventional logic process.

The combination of a non-volatile memory process and a conventional logic process results in a much more complicated and expensive "merged non-volatile memory and logic" process to implement system-on-chip integrated circuits. This is undesirable, because the typical usage of the non-volatile memory block in an SOC application is small in relation to the overall chip size.

Various proposals have been put forward in the past. FIG. 1 is a top view of a non-volatile cell V0 capable of being integrated into CMOS logic process, as proposed by Han et al. in U.S. Pat. No. 6,788,574. Non-volatile memory cell V0 includes a coupling capacitor, a read transistor and a tunneling capacitor. More specifically, non-volatile memory cell V0 includes N-well regions 11 and 12, N+ active regions 21-24, N+ contacts 31-34, P+ active regions 41-42, P+ contacts 51-52, and a polysilicon floating gate 60. Polysilicon floating gate 60 is substantially N+ polysilicon, with the exception of P+ polysilicon regions 65A and 65B and N+ polysilicon region 62. Polysilicon floating gate 60 forms a coupling capacitor gate 61, a read transistor gate 62 and a tunneling capacitor gate 63. A P-type channel region (not shown) exists between N+ active regions 23 and 24 of the read transistor.

Polysilicon floating gate 60 is deposited onto an insulating material (not shown) that separates the coupling capacitor gate 61, read transistor gate 62 and tunneling capacitor gate 63 from the underlying active regions. Coupling capacitor gate 61 acts as a first plate of the coupling capacitor and P+ active region 41 (which abuts N+ active region 21) acts as the second plate of the coupling capacitor. N+ contacts 31 and P+ contact 51 are electrically connected to form a common terminal. Tunneling capacitor gate 63 acts as a first plate of the tunneling capacitor and P+ active region 42 (which abuts N+ active region 22) acts as the second plate of the tunneling capacitor. N+ contact 32 and P+ contact 52 are electrically connected to form a common terminal. The operation of non-volatile memory cell V0 is described in detail in U.S. Pat. No. 6,788,574.

Non-volatile memory cell V0 has several limitations. First, the coupling capacitor is a large area MOS structure. Consequently, when the coupling capacitor operates in depletion mode, the capacitance of this structure is decreased, and the gate voltage control is degraded. Second, non-volatile memory cell V0 contains at least two independent N-Well regions 11 and 12, thereby increasing cell size. Finally, the usage of N+ polysilicon for a large area of capacitor control gate 61 increases the gate oxide leakage of memory cell V0, as it is well known that N+ polysilicon gates conduct significantly more current than P+ polysilicon gates, when biased in inversion mode. (See, e.g., Shi et al., "Polarity-Dependent Tunneling Current and Oxide Breakdown in Dual-Gate CMOSFET's", IEEE Electron Device Letters, vol. 19, No. 10, October 1998, pp. 391-393.) This compromises data retention of non-volatile memory cell V0.

It would therefore be desirable to have a method and structure for implementing a non-volatile memory array on an integrated circuit that is fabricated using a conventional logic process and circumvents the limitations introduced by the prior art.

SUMMARY

Accordingly, the present invention provides a way to fabricate non-volatile memory cells using a conventional logic process without any process step modification. These non-volatile memory cells use a gate dielectric layer typically used in input/output (I/O) devices of an integrated circuit. For example, this gate dielectric layer can have a thickness in the range of about 4 nm to 7 nm, (while logic transistors fabricated on the same integrated circuit have a thickness in the range of 1.5 to 2.2 nm). The non-volatile memory cells can be programmed and erased using relatively low voltages compared to conventional non-volatile memory cells. The voltages required to program and erase can be provided by transistors readily available in a conventional logic process (i.e., transistors having a transistor avalanche breakdown voltage in the range of 5 Volts to 7 Volts).

In one embodiment, the non-volatile memory cell includes a PMOS coupling capacitor, a PMOS access transistor, and an NMOS programming transistor, which share a floating gate electrode. The NMOS programming transistor has N− LDD extension regions that under-lap the floating gate electrode and are electrically shorted (by transistor punch-through or direct contact). This under-lap can be formed by providing a floating gate electrode having a width less than a minimum design width parameter and/or by using an LDD implant typically used for I/O transistors of the integrated circuit. The short reduces the maximum electric field at the most graded part of the junction and therefore increases the junction-to-well breakdown voltage. The short also increases the coupling between the LDD extensions and the floating gate electrode.

The PMOS coupling capacitor also has an LDD extension that extends a relatively large distance under the floating gate electrode, thereby increasing the coupling of the LDD extensions of coupling capacitor to the floating gate.

In one embodiment, the non-volatile memory cells are fabricated using a conventional single-polysilicon logic process, which is standard in the industry, with a silicon dioxide or nitrided silicon dioxide gate dielectric layer. It is understood, however, that essentially the same approach to non-volatile memory cells can be achieved with gate materials other than poly-silicon (such as metal gate materials and so on), and with gate dielectrics other than silicon dioxide (such as hi-K dielectrics and so on). Therefore, a single polysilicon process includes a process with a single metallic gate material and oxide or hi-K dielectric gate material.

The present invention will be more fully understood in view of the following description and drawings.

BRIEF DESCRIPTION OF THE DRAWINGS

FIGS. 5A, 5B and 5C are tables that define the programming, erase and read operations, respectively, of the array of FIG. 4 in accordance with one embodiment of the present invention.

FIGS. 6A and 6B are tables that define the programming and erase operations, respectively, of the array of FIG. 4 in accordance with an alternative embodiment of the present invention.

FIG. 9 is a table that defines an alternative method of erasing the memory array of FIG. 4.

FIGS. 12A, 12B and 12C are tables that define the programming, erase and read operations, respectively, of the array of FIG. 11 in accordance with one embodiment of the present invention.

FIGS. 13A and 13B are tables that define the programming and erase operations, respectively, of the array of FIG. 11 in accordance with an alternate embodiment of the present invention.

FIG. 14 is a table that defines an alternative method of performing an erase operation on the memory array of FIG. 11 in accordance with an alternate embodiment of the present invention.

DETAILED DESCRIPTION

Note the general nature of the present invention is in no manner limited by the specific values used in the descriptions and drawings. For example, it is assumed that 5 Volts is less than what is commonly known in industry as junction-to-well breakdown voltage. A voltage of magnitude close to 5 Volts applied across the gate dielectric layer of a device in the described embodiments does not introduce significant tunneling current through this gate dielectric layer. However, a voltage of magnitude close to 10 Volts applied across the gate dielectric layer of a device in the described embodiments does introduce significant tunneling current through this gate dielectric layer. Moreover, a voltage of magnitude close to 10 Volts is less than what is commonly known in industry as well-to-well breakdown voltage, due to lower concentration of well dopants. In the embodiments described below, particular numbers are used to denote the voltages applied to different terminals of various non-volatile memory cells. It is understood that those voltages need not be exact while used across drawings and embodiments, and need not be exact while used in the same drawing and embodiment; these voltages only convey the general concept of the biasing schemes.

Figure 1:
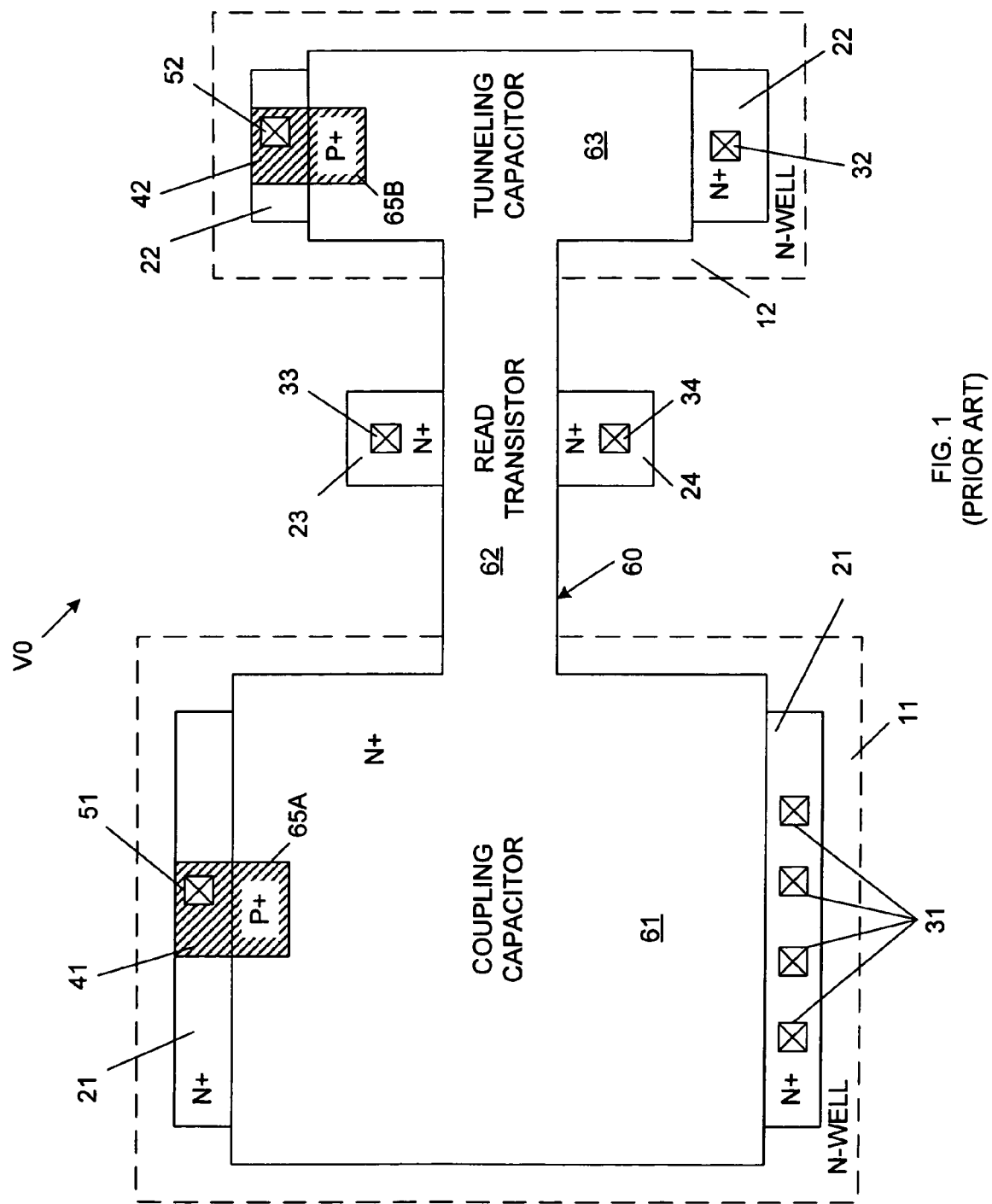
FIG. 1 is a top view of a conventional non-volatile memory cell capable of being integrated into a CMOS logic process.
Figure 2:
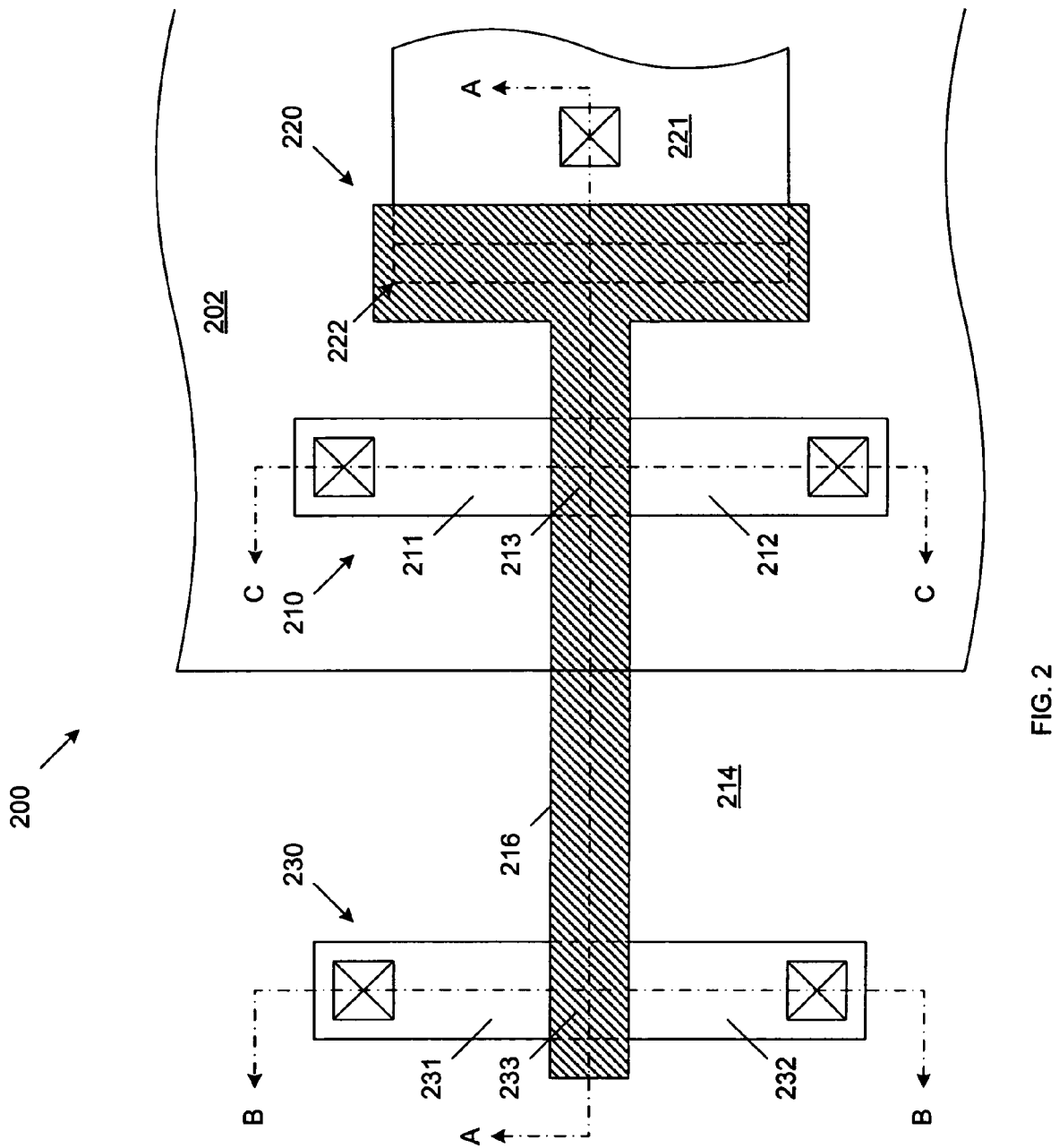
FIG. 2 is a top layout view of a non-volatile memory cell in accordance with one embodiment of the present invention.

FIG. 2 is a top layout view of a non-volatile memory cell 200 in accordance with one embodiment of the present invention. Non-volatile memory cell 200 includes a PMOS access transistor 210, a PMOS control capacitor 220 and an NMOS programming transistor 230.

Figure 3A:
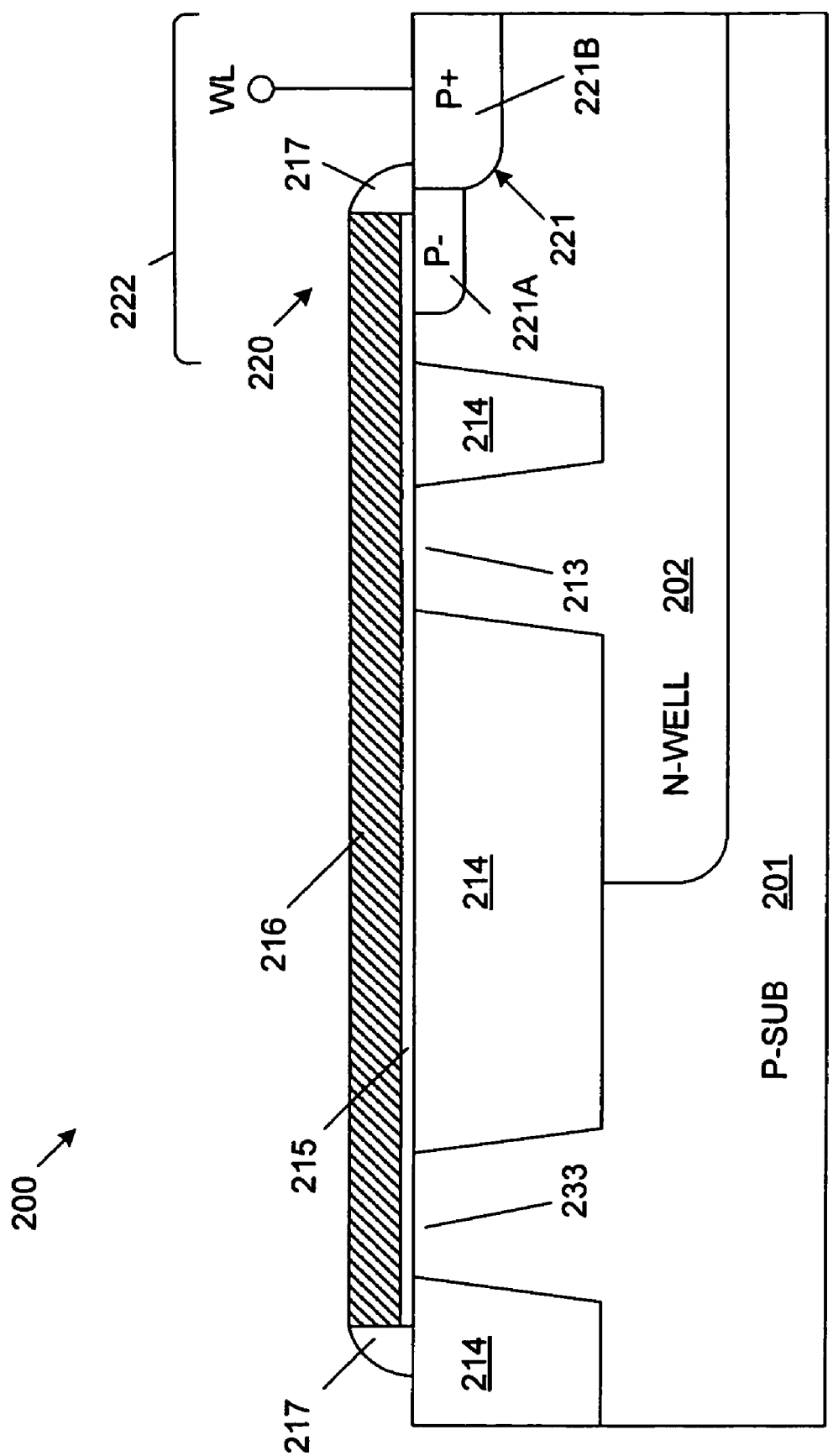
FIG. 3A is a cross-sectional view of a non-volatile memory cell 200 along section line A-A of FIG. 2.
Figure 3B:
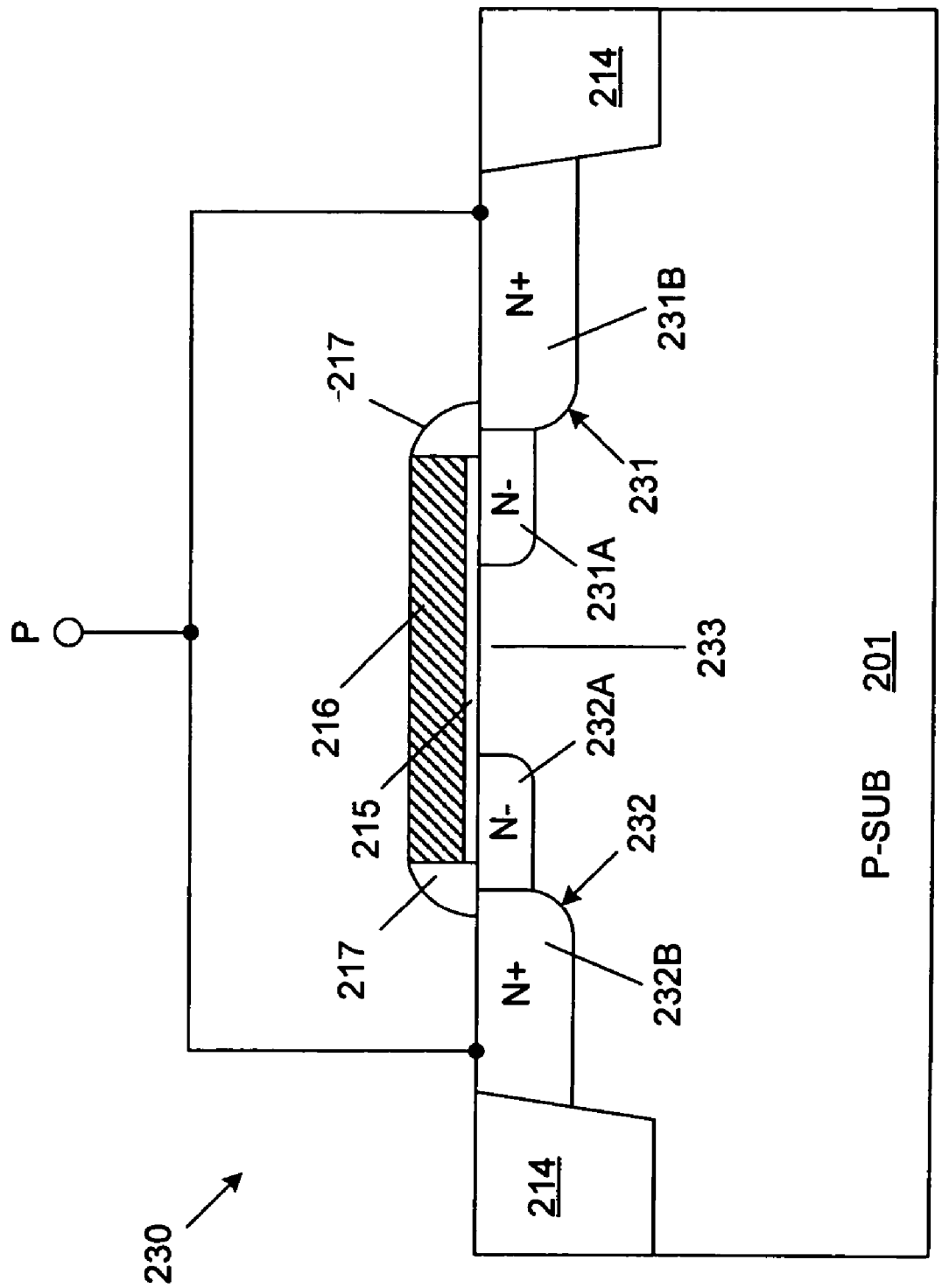
FIG. 3B is a cross-sectional view of a non-volatile memory cell along section line B-B of FIG. 2.
Figure 3C:
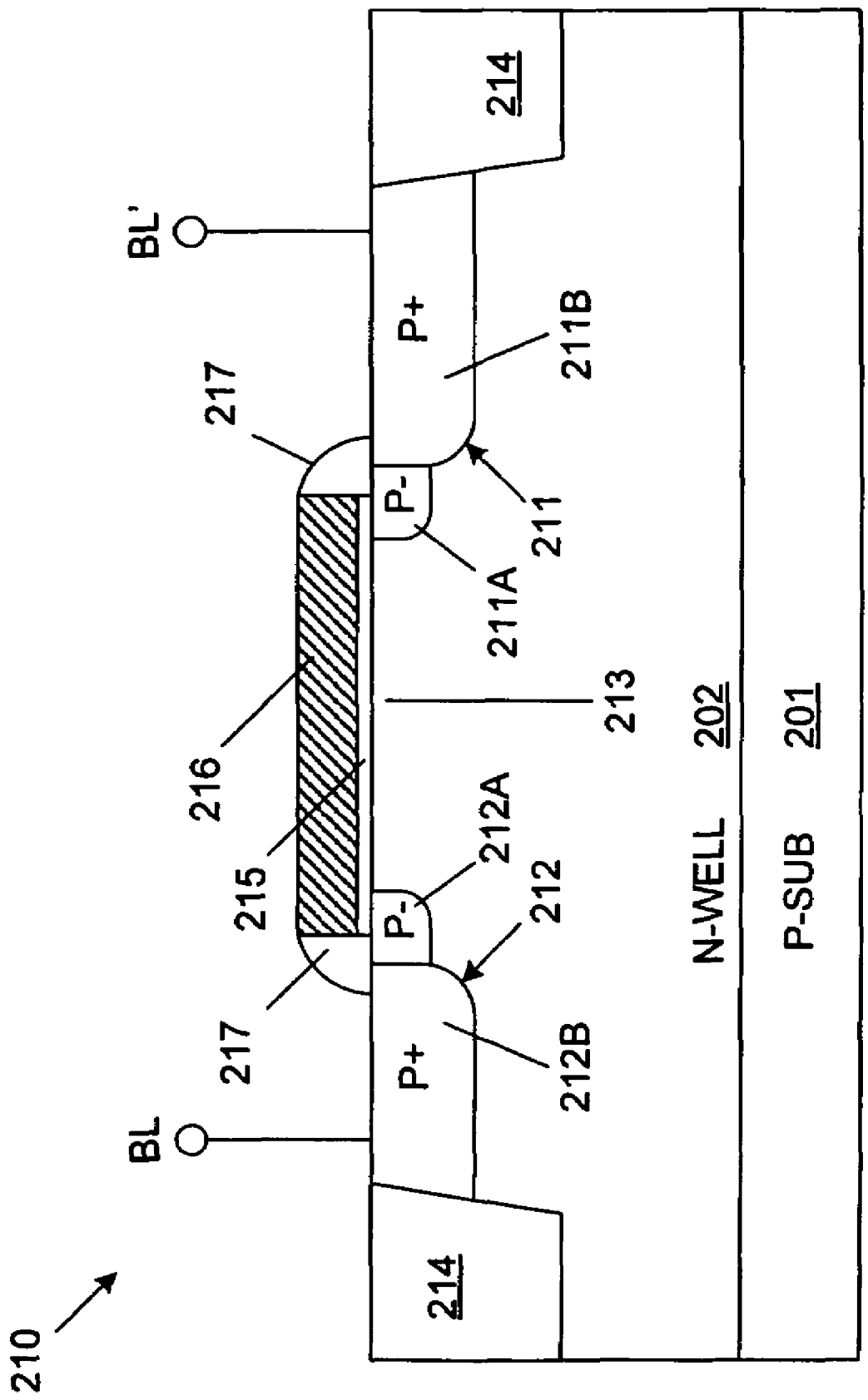
FIG. 3C is a cross-sectional view of a non-volatile memory cell along section line C-C of FIG. 2.

FIG. 3A is a cross sectional view of non-volatile memory cell 200 along section line A-A of FIG. 2. FIG. 3B is a cross sectional view of non-volatile memory cell 200 along section line B-B of FIG. 2. FIG. 3C is a cross sectional view of non-volatile memory cell 200 along section line C-C of FIG. 2. In the described example, non-volatile memory cell 200 is fabricated using a conventional logic process having low-voltage logic transistors and high-voltage input/output (I/O) transistors manufactured on the same chip. Non-volatile memory cell 200 is operated in response to a positive supply voltage ($V_{DD}$), which is characteristic to the conventional logic process (e.g., around 1 Volt), and a ground supply voltage ($V_{SS}$) of 0 Volts.

Non-volatile memory cell 200 is fabricated in a p-type mono-crystalline semiconductor substrate 201 (see FIGS. 3A, 3B, 3C). In the described embodiment, substrate 201 is p-doped silicon.

Field dielectric region 214 defines the active regions of PMOS access transistor 210, PMOS control capacitor 221 and NMOS programming transistor 230. In the described embodiment, field dielectric region 214 includes shallow trench isolation (STI) regions, which define silicon islands (i.e., the active regions). Field dielectric region 214 may be made of silicon oxide or another dielectric material.

A gate dielectric layer 215 is located over selected portions of the active regions and field dielectric region 214, as illustrated in FIGS. 3A-3C. In the described embodiment, gate dielectric layer 215 is silicon oxide; however, other dielectric materials can be used in other embodiments. Gate dielectric layer 215 has the same thickness as the gate dielectric layers used in the input/output (I/O) transistors (not shown) fabricated in substrate 201. This gate dielectric layer 215 is thicker than the gate dielectric layers of logic transistors (not shown) fabricated in substrate 201. For example, gate dielectric layer 215 and the gate dielectric layers used in the I/O transistors may have a thickness of about 40 to 70 Angstroms in a 0.1 micron CMOS logic process, while the gate dielectric layers used in the logic transistors of the same process may have a thickness of about 15 to 22 Angstroms. In some embodiments, gate dielectric layer 215 is not formed over field dielectric region 214.

A floating gate electrode 216 extends over the gate dielectric layer 215 and the field dielectric region 214, as illustrated in FIGS. 2 and 3A-3C. As viewed from the top, the floating gate electrode 216 and underlying gate dielectric layer exhibit a "T" shape in the described embodiment. In the described embodiment, floating gate electrode 216 includes conductively doped polycrystalline silicon. Sidewall spacers 217, which are typically formed from silicon nitride or silicon oxide or a combination thereof, are located at the edges of floating gate electrode 216.

As mentioned above, non-volatile memory cell 200 includes a PMOS access transistor 210. Access transistor 210 includes p-type source region 211 and p-type drain region 212 which are formed in an n-type well region 202, as depicted in FIGS. 2 and 3C. Source region 211 includes lightly doped P– source region 211A and heavily doped P+ source contact region 211B. Similarly, drain region 212 includes lightly doped P– drain region 212A and heavily doped P+ drain contact region 212B. An n-type channel region 213 is located between source region 211 and drain region 212. Source region 211 is connected to a bit line (BL) line and drain region 212 is connected to an associated bit line (BL'). Floating gate electrode 216 forms the control gate of PMOS access transistor 210. PMOS access transistor 210 is isolated by adjacent field dielectric regions 214.

Non-volatile memory cell 200 also includes a NMOS programming transistor 230. Programming transistor 230 includes n-type source region 231 and n-type drain region 232, which are formed in p-type substrate 201 as depicted in FIGS. 2 and 2B, or in a p-type well region (not shown). Source region 231 includes lightly doped n-type extension region 231A and heavily doped N+ source contact region 231B. Similarly, drain region 232 includes lightly doped n-type extension region 232A and heavily doped N+ drain contact region 232B. An n-type channel region 233 is located between source region 231 and drain region 232. Source region 231 and drain region 232 are commonly connected to an associated programming line (P) during program, erase and read operations. Alternately, source region 231 and drain region 232 can have separate contacts, which receive the same voltages during program, erase and read operations. Floating gate electrode 216 forms the control gate of NMOS programming transistor 230. NMOS programming transistor 230 is isolated by adjacent field dielectric regions 214.

Non-volatile memory cell 200 further includes PMOS control capacitor 220, which is formed in an active region 222. In the described embodiment, PMOS control capacitor 220 includes a p-type electrode region 221 formed in n-well 202. More specifically, p-type electrode 221 includes a lightly doped p-type extension region 221A and a heavily doped P+ contact region 221B, as illustrated in FIG. 3A. P– type electrode 221 extends under (and is capacitively coupled to) floating gate electrode 216. PMOS control capacitor is isolated by adjacent field dielectric regions 214.

Figure 4:
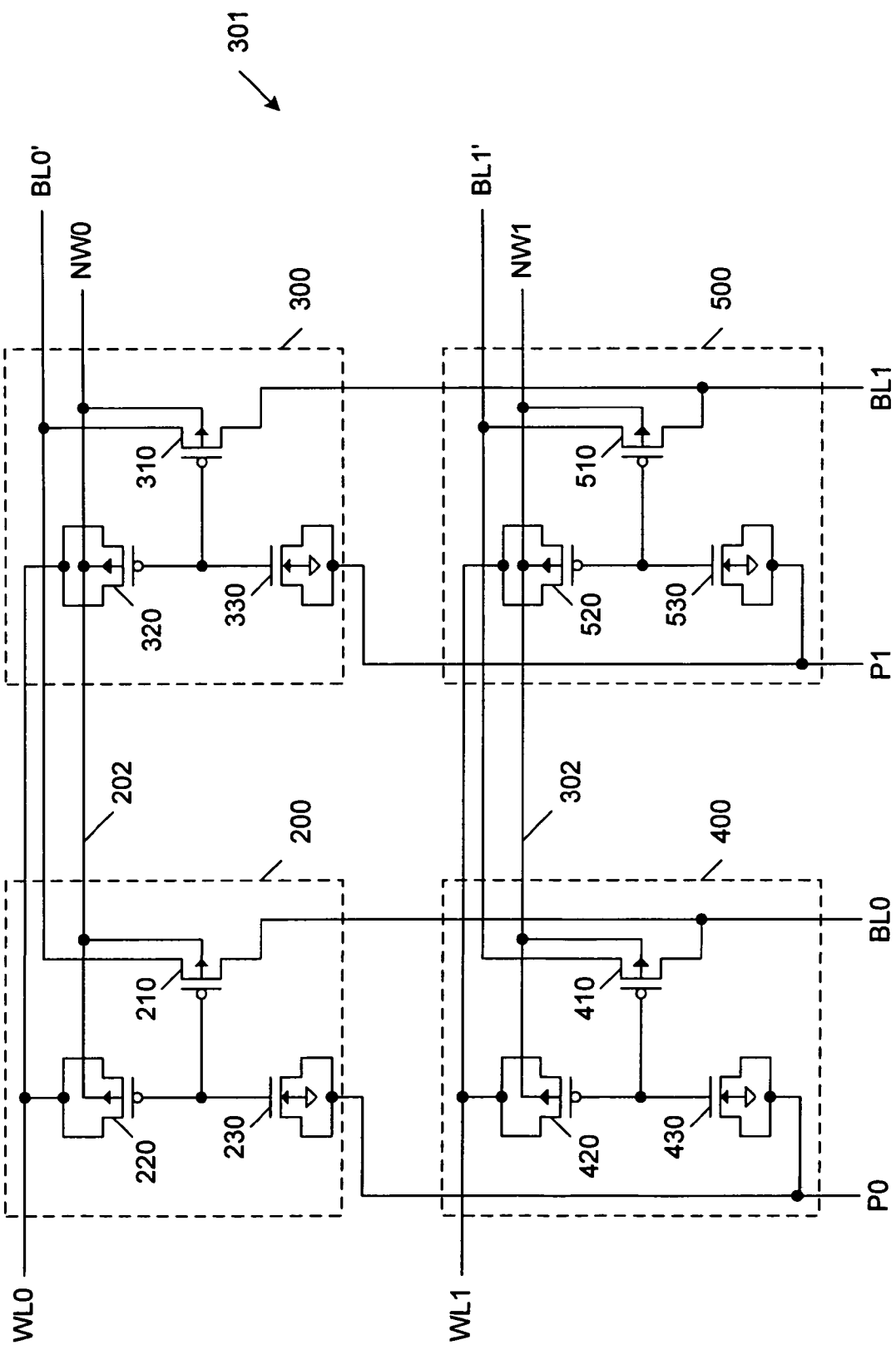
FIG. 4 is a schematic diagram of a 2×2 array of non-volatile memory cells in accordance with one embodiment of the present invention.

FIG. 4 is a schematic diagram of a 2×2 array 301 of non-volatile memory cells 200, 300, 400 and 500. Non-volatile memory cells 300, 400 and 500 are identical to above described non-volatile memory cell 200. Thus, non-volatile memory cells 300, 400 and 500 include PMOS access transistors 310, 410 and 510, NMOS programming transistors 330, 430 and 530, and P-type control capacitors 320, 420 and 520. The source regions of PMOS access transistors 210 and 410 are commonly connected to conductive bit line electrode BL0. Similarly, the source regions of PMOS access transistors 310 and 510 are commonly connected to conductive bit line electrode BL1. The drain regions of PMOS access transistors 210 and 310 are commonly connected to conductive bit line electrode BL0'. The drain regions of PMOS access transistors 410 and 510 are commonly connected to conductive bit line electrode BL1'. PMOS control capacitors 220 and 320 are both connected to conductive word line electrode WL0. Similarly, PMOS control capacitors 420 and 520 are connected to conductive word line electrode WL1. The source/drain regions of NMOS programming transistors 230 and 430 are connected to conductive programming line electrode P0. Similarly, the source/drain regions of NMOS programming transistors 330 and 530 are connected to conductive programming line electrode P1. In the described embodiment, each of the memory cells in a row share a common n-well region, which is isolated from the n-well regions of the other rows. For example, in the described embodiment, non-volatile memory cells 200 and 300 share n-well region 202, while non-volatile memory cells 400 and 500 share a separate n-well region 302 (which is isolated from n-well region 202 by p-type substrate 201). Although the described array has two rows and two columns, it is understood that arrays having other sizes can be implemented.

FIGS. 5A, 5B and 5C illustrate tables 501, 502 and 503, respectively, which define the programming, erase and read operations, respectively, of the array 301 of FIG. 4 in accordance with one embodiment of the present invention.

The programming mode is described in connection with the programming of non-volatile memory cell 200. In the programming mode, a large voltage drop develops between floating gate 216 and the source/drain regions 231-232 of NMOS programming transistor 230. As a result, electrons are selectively removed from floating gate 216 via Fowler-Nordheim or direct tunneling mechanisms or a combination thereof, through gate dielectric layer 215 of NMOS programming transistor 230. As a result, the threshold voltage ($V_{TP}$) of PMOS access transistor 210 becomes more negative.

FIG. 5A is a table 501 which illustrates the specific programming voltages required to program non-volatile memory cell 200 in a particular embodiment. Word line WL0 is held at a voltage of about –5 Volts, while bit line BL0, bit line BL0', n-well regions 202 and 302, and p-type substrate 201 are coupled to receive the ground supply voltage (0 Volts). The programming line P0 is held at a voltage of about 5 Volts. Under these bias conditions, a high voltage drop of about 8 Volts exists across the gate dielectric layer 215 of NMOS programming transistor 230, with the electric field approaching or even exceeding 10 Mega-Volts per centimeter (MV/cm). Under these conditions, electrons in floating gate electrode 216 of NVM memory cell 200 tunnel to the commonly connected source and drain regions 231-232 of NMOS programming transistor 230 (i.e., to program line P0).

In the present example, non-volatile memory cell 300 is not to be programmed. To prevent electrons from being removed from the floating gate electrode of non-volatile memory cell 300, programming line P1 is held at the ground supply voltage of 0 volts. Under this condition, the voltage drop across programming capacitor 330 is substantially less than the voltage required for Fowler-Nordheim tunneling. Thus, no significant electron tunneling occurs within NVM cell 300.

In the present example, non-volatile memory cells 400 and 500 are also not to be programmed. To prevent programming of memory cell 400, word line WL1 is held at the ground supply voltage (0 Volts). Under these bias conditions, the maximum voltage drop across the gate dielectric layer of NVM cell 400 is approximately 4 Volts, which is substantially less than the voltage required for Fowler-Nordheim tunneling. Thus, no significant electron tunneling occurs within NVM cell 400.

Finally, bit line BL1 is held at the ground supply voltage (0 Volts). As a result, all of the transistor terminals of non-volatile memory cell 500 are coupled to the ground voltage supply, such that no significant electron tunneling occurs in this memory cell.

During an erase operation, electrons are injected into the floating gates of memory cells 200, 300, 400 and 500, thereby making the threshold voltages of PMOS access transistors 210, 310, 410 and 510 less negative. The erase operation implements Fowler-Nordheim tunneling from the channel and source/drain regions of NMOS programming transistors

230, 330, 430 and 530. The erase operation is preferably performed in a sector mode, in which all memory cells in a sector sharing same word lines and same bit lines are erased together.

FIG. 5B is a table 502 which illustrates the specific voltages required to erase non-volatile memory cells 200, 300, 400 and 500 in a particular embodiment. In the erase mode, word lines WL0 and WL1, bit lines BL0, BL0', BL1 and BL1', and n-well regions 202 and 302 are all held at a high programming voltage of about 10 Volts. P-type substrate 201 and programming lines P0 and P1 are held at the ground supply voltage (0 Volts). Under these bias conditions, a high voltage drop of about 9 Volts exists across the gate dielectric layers of NMOS programming transistors 230, 330, 430 and 530, thereby creating high electrical fields across these gate dielectric layers. In response to this high electric field, electrons in the channel and source/drain regions of programming transistors 230, 330, 430 and 530 tunnel into the floating gate electrodes of NVM memory cells 200, 300, 400 and 500.

During a read operation, a read control voltage is applied to a control gate of a PMOS access transistor via the associated n-type well region. The read control voltage will either turn on or fail to turn on the associated PMOS access transistor, depending on the programmed/erased state of the associated NVM cell. The on/off state of the PMOS access transistor is sensed, thereby determining whether the associated NVM cell is programmed or erased.

FIG. 5C is a table 503 which illustrates the specific read voltages required to read non-volatile memory cells 200 and 300 in a particular embodiment. To read selected non-volatile memory cells 200 and 300, word lines WL0 and WL1, bit lines BL0, BL1 and BL1', programming lines P0 and P1, n-well region 302 and p-type substrate 201 are held at the ground supply voltage of 0 Volts. The bit line BL0' and n-well region 202 are held at a read voltage of about 1.2 Volts. The voltage of 0 Volts applied to word line electrodes WL0 and WL1 causes a voltage of about 0 Volts to be applied to the floating gate electrodes of NVM cells 200, 300, 400 and 500. In addition, NVM cells 200 and 300 experience a drain/source voltage ($V_{DS}$) of about 1.2 Volts. Under these conditions, current will flow through the access transistors of non-programmed (erased) NVM cells, and no current or a much smaller current will flow through the access transistors of programmed NVM cells. The current on the bit lines is sensed by standard methods, which are well known to persons of ordinary skill in the art.

Because word line WL1, n-well region 302 and bit lines BL0, BL1 and BL1' are all held at 0 volts, there is no voltage drop across the source and drain regions of access transistors 410 and 510. As a result, non-volatile memory cells 400 and 500 do not interface with the bit line signals from the selected memory cells 200 and 300.

The read mode of operation defined by table 503 (FIG. 5C) utilizes word line bias voltages equal to 0 Volts. Although the drain of each access transistor being read is biased to a low voltage of 1.2 Volts, the floating gate voltage does not appreciably change because the coupling from the drain of the access transistor to the floating gate electrode is very small (at least in part because the drain regions of the access transistors are fabricated with the logic extension implant, rather than the I/O extension implant). Consequently, the voltage on the floating gate electrode during a read operation is close to the voltage on the floating gate electrode when no power is applied. As a result, the non-volatile memory cells are not disturbed during read operations.

FIGS. 6A and 6B illustrate tables 601 and 602, respectively, which define an alternative method of operating the array of FIG. 4. In this embodiment, the program and erase operations defined by FIGS. 5A and 5B are essentially reversed.

To program non-volatile memory cell 200 as defined by FIG. 6A, word line WL0 and n-well region 202 are held at a voltage of about 10 Volts, while word line WL1, programming line P0, n-well region 302, and p-type substrate 201 are coupled to receive the ground supply voltage (0 Volts). Bit lines BL0 and BL0' are held at a voltage of about 10 Volts (or are left floating). Bit lines BL1 and BL1' are coupled to the ground supply voltage (or are left floating). The programming line P1 is held at a voltage of about 5 Volts. Under these bias conditions, a high voltage drop of about 9 Volts exists across the gate dielectric layer 215 of programming transistor 230 of memory cell 200 (wherein the voltage on the floating gate 216 is high). This bias scheme causes electrons to tunnel into the floating gate electrode 216, thereby causing the threshold voltage $V_{TP}$ of PMOS access transistor 210 to be less negative. Memory cells 300 and 400 see significantly less voltage drop across their respective gate dielectric layers (between 4 and 5 Volts), which prevents carrier tunneling across these gate dielectric layers. NVM cell 500 does not experience any voltage drop across its gate dielectric layer.

To erase non-volatile memory cells 200, 300, 400 and 500 as defined by FIG. 6B, word lines WL0 and WL1 are held at a voltage of about −5 Volts, while n-well regions 202 and 302 and p-type substrate 201 are coupled to receive the ground supply voltage (0 Volts). Bit lines BL0, BL0', BL1 and BL1' are coupled to receive the ground supply voltage (or are left floating). Programming lines P0 and P1 are held at a voltage of about 5 Volts. Under these bias conditions, each of the non-volatile memory cells 200, 300, 400 and 500 experiences a voltage drop of about 9 Volts across the gate dielectric layers of program transistors 230, 330, 430 and 530, with the floating gate electrodes being at low voltages. Under these bias conditions, electron tunneling is induced from the floating gate electrodes, thereby making the threshold voltages $V_{TP}$ of PMOS access transistors 210, 310, 410 and 510 more negative.

The read mode defined by table 503 of FIG. 5C can be used to read non-volatile memory cells programmed and erased in the manner defined by tables 601 and 602 of FIGS. 6A and 6B.

Figure 7:
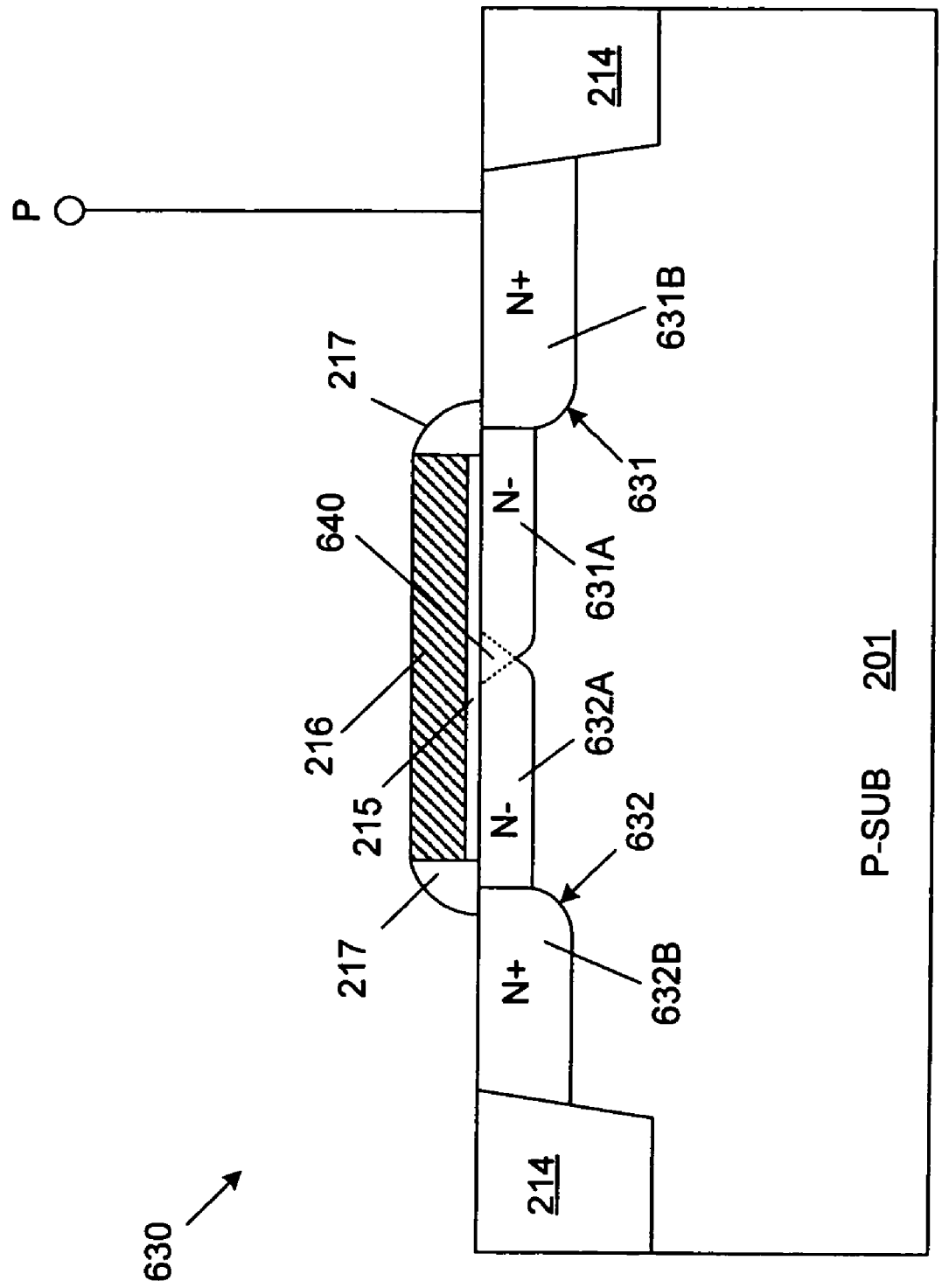
FIG. 7 is a cross-sectional view of an NMOS programming transistor in accordance with an alternate embodiment of the present invention.

FIG. 7 is a cross-sectional view of an NMOS programming transistor 630 in accordance with an alternate embodiment of the present invention. In this embodiment, NMOS programming transistor 630 replaces NMOS programming transistor 230 (FIGS. 2, 3B and 4) in memory cell 200. NMOS programming transistor 630 can be viewed as a modification of NMOS programming transistor 230, wherein source region 231 and drain region 232 of programming transistor 230 are extended under floating gate electrode 216, such that source region 231 becomes continuous with drain region 232.

NMOS programming transistor 630 includes n-type source region 631 and n-type drain region 632, which are formed in p-type substrate 201, or in a p-type well region (not shown). Source region 631 includes lightly doped N− extension region 631A and heavily doped N+ source contact region 631B. Similarly, drain region 632 includes lightly doped N− extension region 632A and heavily doped N+ drain contact region 632B. N-type extension regions 631A and 632A meet (i.e., are continuous) at region 640. That is, source region 631 contacts drain region 632 under the upper surface of substrate 201. Floating gate electrode 216, gate dielectric layer 215, sidewall dielectric spacers 217 and field dielectric region 214 have been described above in connection with FIG. 3B.

Because the n-type extension regions 631A and 632A are electrically coupled, only one connection is required to a source/drain region of NMOS programming transistor 630. Thus, in one embodiment, only source region 631 is connected to the associated programming line (P). Alternately, only drain region 632 is connected to the associated programming line (P). Advantageously, a contact can be eliminated from the structure of FIG. 3B. In yet another embodiment, the programming line (P) can be coupled to both the source region 631 and the drain region 632.

N-type extension regions 631A and 632A can be brought into contact by using a gate channel width substantially smaller than minimum design rule channel width allowed for a standard NMOS transistor. For example, in a 0.35 micron CMOS logic process, the floating gate electrode 216 may be given a width of about 0.2 microns, at least at the location where NMOS programming transistor 230 is to be fabricated. Alternately, N-type extension regions 631A and 632A can be brought into contact by using the extension implants typically used for the high-voltage input/output (I/O) transistors fabricated on the same chip as non-volatile memory cell 200 (hereinafter referred to as I/O extension implants). I/O extension implants extend further under the gate electrode 215 than the extension implants used to form logic transistors (hereinafter referred to as logic extension implants). In the described embodiments, p-type extension regions 211A and 212A of access transistor 210 are formed by logic extension implants, and p-type extension region 221A of the cell capacitor (FIG. 3A) is formed of I/O extension implants. A combination of channel length adjustment and I/O extension implants can be used in other embodiments. Note that under-diffusion of the n-type extension implants 631A-632A eliminates the most abrupt junction profiles 640 right at the edge of silicon surface (shown by dashed lines in FIG. 7). As a result, the permissible junction-to-well voltage advantageously increases from just above 5 Volts to a larger voltage, just above 8 Volts. In addition, any hot carriers generated in the junction will recombine inside the under-diffused layer under the gate dielectric layer 215 and not inject into the gate dielectric layer 215, thereby increasing the reliability of the gate dielectric layer 215.

Figure 8:
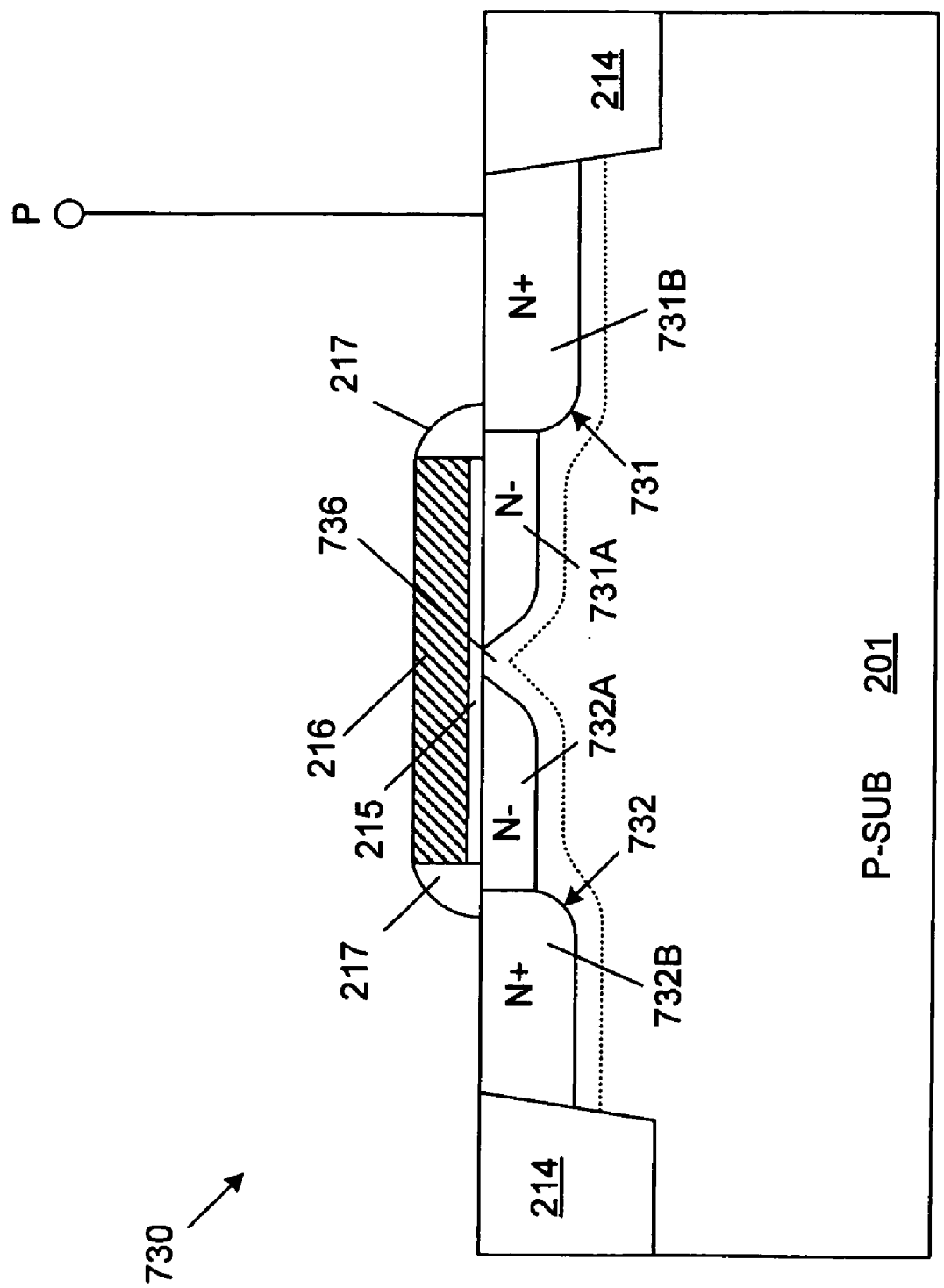
FIG. 8 is a cross-sectional view of an NMOS programming transistor in accordance with yet another embodiment of the present invention.

FIG. 8 is a cross-sectional view of an NMOS programming transistor 730 in accordance with another embodiment of the present invention. Because NMOS programming transistor 730 is similar to NMOS programming transistor 630 (FIG. 7), similar elements in FIGS. 7 and 8 are labeled with similar reference numbers. Thus, NMOS programming transistor 730 includes p-type substrate 201, field dielectric region 214, gate dielectric layer 215, floating gate electrode 216, and sidewall dielectric spacers 217. In addition, NMOS programming transistor 730 includes source region 731 and drain region 732. Source region 731 includes N− extension region 731A and N+ contact region 731B. Similarly, drain region 732 includes N− extension region 732A and N+ contact region 732B. N-type source and drain extension regions 731A and 732A do not physically contact each other under floating gate electrode 216. However, there is a conduction path between extension regions 731A and 732A, which electrically shorts source region 731 and drain region 732 of programming transistor 730 by means of transistor punch-through. This conduction path is formed when depletion layers originating from source extension region 731A and drain extension region 732A physically merge under floating gate electrode 216 and form a single depletion region 736. Because depletion region 736 fully extends from one junction to another, the maximum electric field at the semiconductor surface is reduced, and source extension region 731A is effectively guarded by drain extension region 732A and vice versa.

As a result, the junction breakdown voltage is advantageously increased to a level just above 8 Volts. Note that the embodiment of FIG. 7 is a special case of the embodiment of FIG. 8, wherein the depletion region width between the two junctions formed by extension regions 631A and 632A is equal to zero.

In addition to increasing junction breakdown voltage, the increased under-diffusion of the source and drain extension regions in FIGS. 7 and 8 also enhances the capacitive coupling between programming line P and the floating gate electrode 216. Note that enhanced under-diffusion achieved by using a gate channel length substantially smaller than the allowed channel length, which results in increase of junction breakdown voltage and better diffusion-to-gate capacitive coupling, is beneficial for any embedded non-volatile memory cell which relies on a diffusion-controlled control gate and on high junction-to-well voltages during program or erase operation.

In accordance with another embodiment of the present invention, the capacitive coupling between the word line (WL) and floating gate electrode 216 of non-volatile memory cell 200 is also enhanced when p-type extension region 221A (FIG. 3A) is formed by I/O extension implant.

FIG. 9 is a table 900 that defines an alternative method of erasing the memory array 301 of FIG. 4. In accordance with this alternate method, the cells of memory array 301 are programmed in the manner defined by table 601 of FIG. 6A, and are read in the manner defined by table 503 of FIG. 5C. As will become apparent in view of the following disclosure, this alternate method utilizes only positive bias voltages.

The present method assumes that each of NMOS programming transistors 230, 330, 430 and 530 has an I/O extension region which under-diffuses beneath the respective floating gate electrodes as described above in conjunction with FIGS. 7 and 8. The erase operation is performed by pulsing program lines P0 and P1 to a voltage of about 8 Volts. This erase voltage is selected to be less than the junction-to-well breakdown voltage of the programming transistors 230, 330, 430 and 530 (whose diffusion junctions under-diffuse as shown in FIG. 7 or FIG. 8), but larger than the breakdown voltage of a stand-alone junction and large enough to induce tunneling across the gate dielectric layers of these programming transistors. Word lines WL0 and WL1, n-well regions 202 and 302 and p-type substrate 201 are held at the ground supply voltage. Bit lines BL0, BL0', BL1 and BL1' are held at the ground supply voltage, or are allowed to float.

Under these bias conditions, each of the non-volatile memory cells 200, 300, 400 and 500 experiences a voltage drop of about 8 Volts across the gate dielectric layers of program transistors 230, 330, 430 and 530, with the floating gate electrodes being at low voltages. Under these bias conditions, electron tunneling is induced from the floating gate electrodes, thereby making the threshold voltages $V_{TP}$ of PMOS access transistors 210, 310, 410 and 510 more negative.

Figure 10:
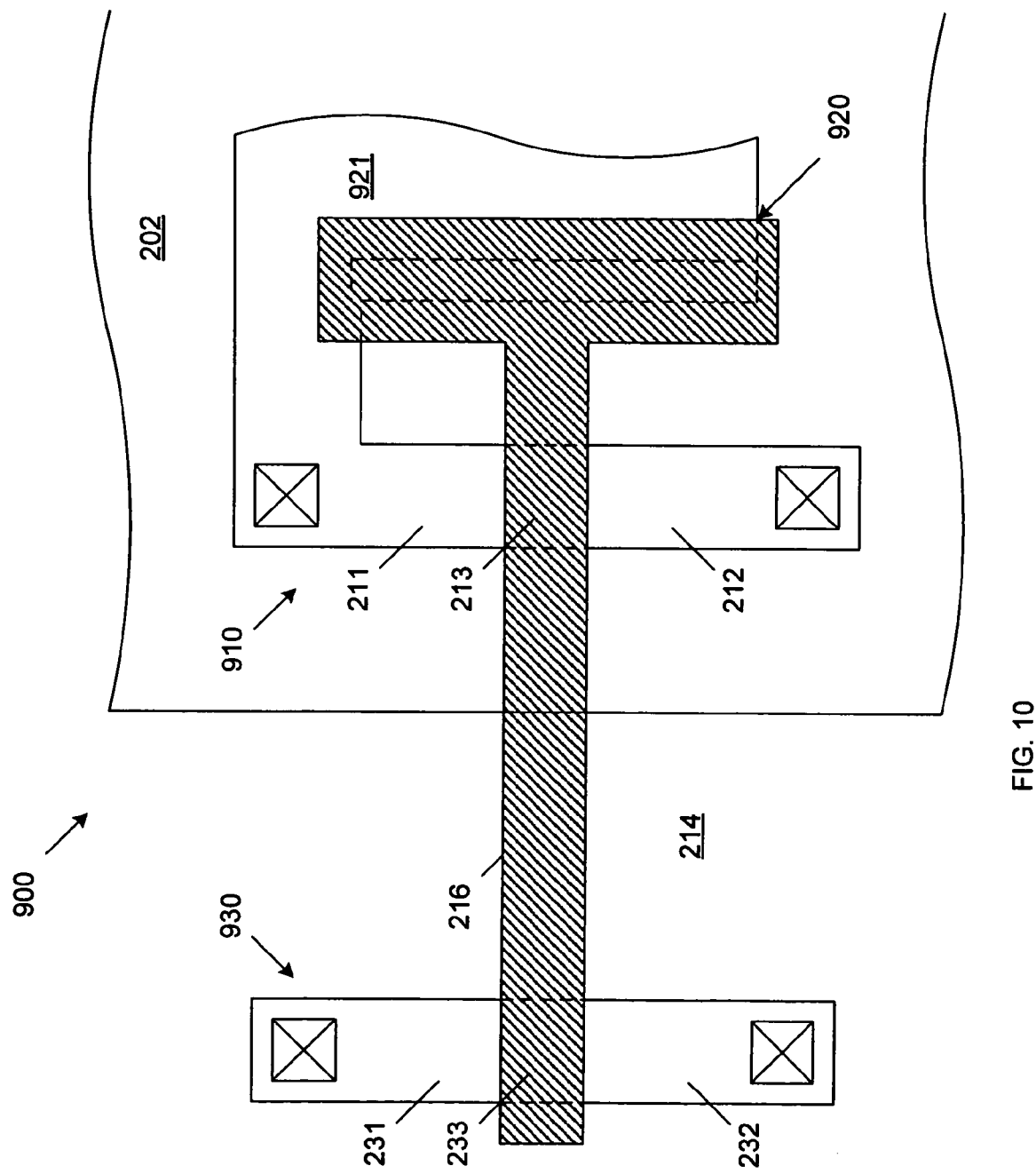
FIG. 10 is a top layout view of a non-volatile memory cell in accordance with another embodiment of the present invention.

FIG. 10 is a top layout view of a non-volatile memory cell 900 in accordance with another embodiment of the present invention. Because non-volatile memory cell 900 is similar to non-volatile memory cell 200 (FIG. 2), similar elements in FIGS. 2 and 10 are labeled with similar reference numbers. Thus, non-volatile memory cell 900 includes PMOS access transistor 910 and NMOS programming transistor 930, which are substantially the same as PMOS access transistor 210 and NMOS programming transistor 230. In addition, non-volatile memory cell 900 includes a PMOS control capacitor 920 having a p-type diffusion electrode 921, which is similar to p-type electrode 221 (FIG. 2), but is continuous with p-type source region 211 of PMOS access transistor 910. Because PMOS access transistor 910 shares the same source contact with PMOS control capacitor 920, one contact is eliminated in the cell 900. As a result, the required cell layout area is reduced by about 20%.

In various embodiments, NMOS programming transistor 930 can be fabricated in accordance with the teachings of FIGS. 7 and 8 above. In addition, p-type electrode 921 may include an I/O extension implant, thereby optimizing the capacitance of PMOS control capacitor 920, in accordance with the teaching of FIGS. 7 and 8 applied to PMOS.

Figure 11:
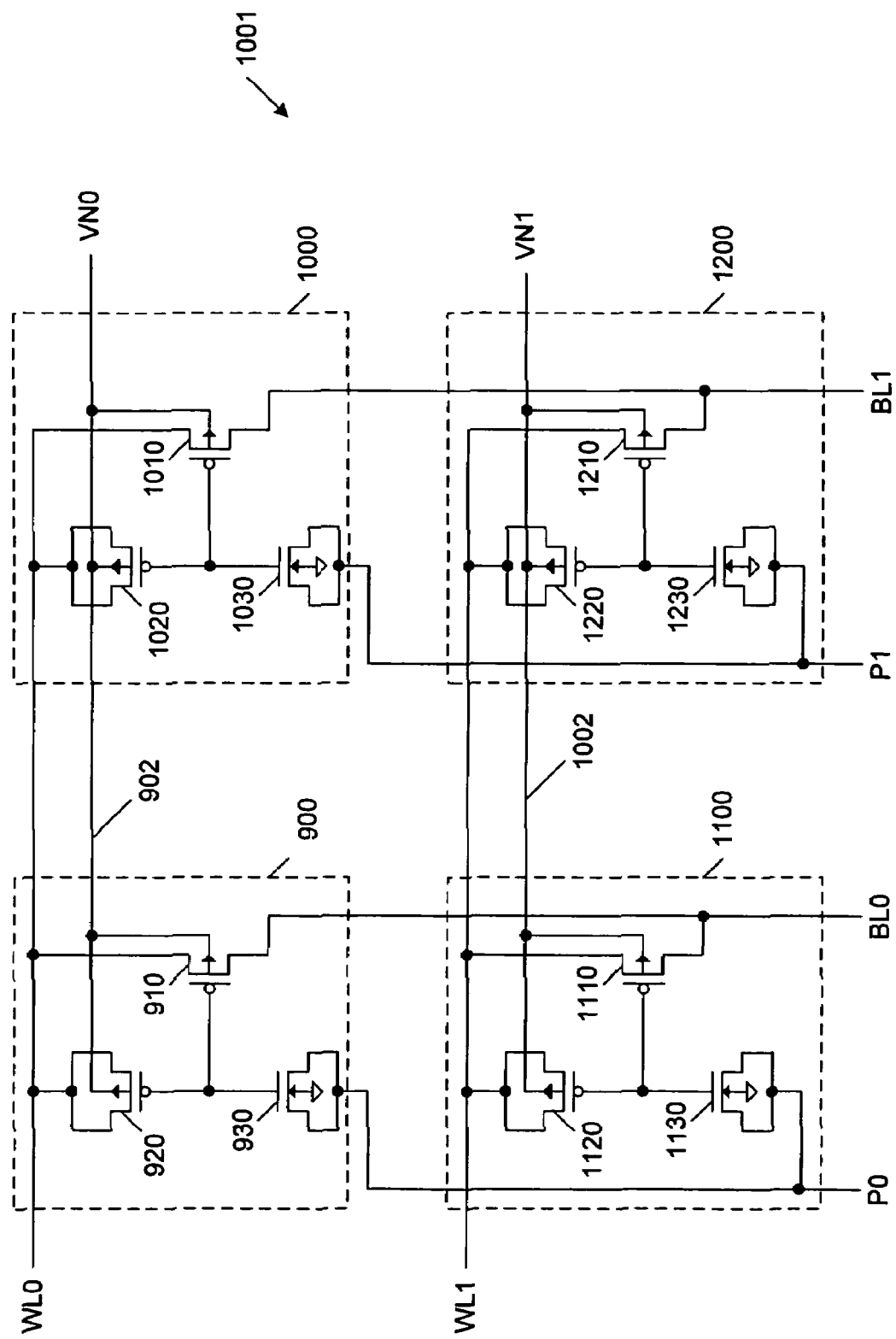
FIG. 11 is a schematic diagram of a 2×2 array of non-volatile memory cells which are identical to the non-volatile memory cell of FIG. 10, in accordance with one embodiment of the present invention.

FIG. 11 is a schematic diagram of a 2×2 array 1001 of non-volatile memory cells 900, 1000, 1100 and 1200. Non-volatile memory cells 1000, 1100 and 1200 are identical to above described non-volatile memory cell 900. Thus, non-volatile memory cells 1000, 1100 and 1200 include PMOS access transistors 1010, 1110 and 1210, NMOS programming transistors 1030, 1130 and 1230, and PMOS control capacitors 1020, 1120 and 1220. The source regions of PMOS access transistors 910 and 1010 are commonly connected to word line WL0. Similarly, the source regions of PMOS access transistors 1110 and 1210 are commonly connected to word line WL1. The drain regions of PMOS access transistors 910 and 1110 are commonly connected to bit line BL0. The drain regions of PMOS access transistors 1010 and 1210 are commonly connected to bit line BL1. The p-type diffusion electrodes of PMOS coupling capacitors 920 and 1020 are both connected to word line WL0. Similarly, the p-type diffusion electrodes of PMOS coupling capacitors 1120 and 1220 are connected to word line WL1. The source/drain regions of NMOS programming transistors 930 and 1130 are connected to programming line P0. Similarly, the source/drain regions of NMOS programming transistors 1030 and 1230 are connected to programming line P1.

In the described embodiment, each of the memory cells in a row share a common n-well region, which is isolated from the n-well regions of the other rows. For example, in the described embodiment, NVM cells 900 and 1000 share n-well region 902, while NVM cells 1100 and 1200 share a separate n-well region 1002 (which is isolated from n-well region 902 by p-type substrate 201). Although the described array 1001 has two rows and two columns, it is understood that arrays having other sizes can be implemented in accordance with the teachings of the present embodiment.

FIGS. 12A, 12B and 12C illustrate tables 1201, 1202 and 1203, respectively, which define the programming, erase and read operations, respectively, of the array 1001 of FIG. 11 in accordance with one embodiment of the present invention. Advantageously, bit lines BL0' and BL1' of array 301 are eliminated in array 1001.

FIG. 12A displays a table 1201 that defines a biasing scheme for a program mode, wherein memory cell 900 is selected for programming. In this program mode, word line WL0 is held at a voltage of about −5 Volts, while word line WL1, program line P1, n-well regions 902 and 1002 and p-type substrate 201 are coupled to receive the ground supply voltage (0 Volts). Bit lines BL0 and BL1 are held at the ground supply voltage, or are left floating. The programming line P0 is held at a voltage of about 5 Volts. Under these conditions, there is a large voltage drop of about 9 Volts across the gate dielectric layer of NMOS programming transistor 930, with the floating gate electrode 216 being at a low voltage. As a result, electrons tunnel from the floating gate electrode 216 through the gate dielectric layer onto programming line P0, thereby making threshold voltage of PMOS access transistor 910 more negative. Memory cells 1000 and 1100 have substantially smaller voltages across their respective gate dielectric layers and thus do not exhibit carrier tunneling. Memory cell 1200 experiences no disturb at all during the programming operation.

FIG. 12B displays a table 1202 that defines a biasing scheme for an erase mode, wherein memory cells 900, 1000, 1100 and 1200 are simultaneously erased. In the erase mode, word lines WL0 and WL1, bit lines BL0 and BL1 and n-well regions 902 and 1002 are held at a voltage of about 10 Volts, while programming lines P0 and P1 and p-type substrate 201 are coupled to receive the ground supply voltage (0 Volts). Under these bias conditions, there is voltage drop of about 9 Volts across the gate dielectric layers of programming transistors 910, 1010, 1110 and 1210, with the floating gate electrodes having a relatively high voltage. As a result, electrons tunnel from the programming lines P0 and P1 onto the floating gate electrodes of memory cells 900, 1000, 1100 and 1200, thereby making threshold voltages of the PMOS access transistors 910, 1010, 1110, and 1210 less negative.

FIG. 12C displays a table 1203 that defines a biasing scheme for a read mode, wherein memory cells 900 and 1000 are read. In the read mode, word line WL0 and p-type substrate 201 are coupled to receive the ground supply voltage (0 Volts). Bit lines BL0 and BL1 and n-well region 902 are held at a read voltage of about 1.2 Volts. Non-selected word line WL1 and n-well region 1002 are left floating. The programming lines P0 and P1 are held at the ground supply voltage, or are left floating. Under these conditions, current will flow through access transistor 910 (or access transistor 1010) if memory cell 900 (or memory cell 1000) is erased. Conversely, no current, or significantly smaller current, will flow through access transistor 910 (or access transistor 1010) if memory cell 900 (or memory cell 1000) is programmed. Note that memory cells 1100 and 1200 are effectively removed from the read operation by the floating state of n-well region 1002 and word line WL1. The presence or absence of read current on bit lines BL0 and BL1 is detected by sensing means known to those of ordinary skill in the art.

In order to achieve an adequate read operation, it is essential to choose the program and erase bias voltages such that during the read modes defined by tables 403 (FIG. 4C) and 1103 (FIG. 11C), the access transistors of the memory cells to be read are turned on (i.e. conducting current) in one state (e.g., the erased state) and are turned off (i.e. non-conducting) in the other state (e.g., the programmed state).

For example, a typical PMOS transistor has a threshold voltage $V_{TP}$ of about −0.7 Volts. Therefore, applying 0 Volts to the gate and drain of a PMOS transistor, and applying a voltage of about 1.2 Volts to the n-well region and the source of a typical PMOS transistor will put the transistor in the off-state.

In order to program memory cell 200 (as defined in FIG. 5A) or program memory cell 900 (ads defined in FIG. 12A), electrons are injected into the associated floating gate electrode, thereby making the threshold voltage $V_{TP}$ of the PMOS access transistor (e.g., 210 or 910) less negative. Injecting electrons into the floating gate electrode places the PMOS access transistor, and most importantly, the large PMOS control capacitor, into inversion (i.e., turned off) during a power-off condition. Because the inversion-biased PMOS gate current is suppressed due to a larger hole tunneling barrier and inadequate supply of electrons available for gate tunneling, the present biasing scheme increases data retention, in a manner generally described by Shi et al, "Polarity-Dependent Tunneling Current and Oxide Breakdown in Dual-Gate CMOSFET's", IEEE Electron Device Letters, vol. 19, No. 10, October 1998, pp. 391-393.

FIGS. 13A and 13B illustrate tables 1301 and 1302, respectively, which define the programming and erase operations, respectively, of the array 1001 of FIG. 11 in accordance with an alternate embodiment of the present invention.

FIG. 13A displays a table 1301 that defines a biasing scheme for a program mode, wherein memory cell 900 is selected for programming. In this program mode, word line WL0 and n-well region 902 are held at a voltage of about 10 Volts, while word line WL1, program line P0, n-well region 1002 and p-type substrate 201 are coupled to receive the ground supply voltage (0 Volts). Bit line BL0 is held at a voltage of about 10 Volts, or is left floating. Bit line BL1 is held at a voltage of 0 Volts, or is left floating. The programming line P1 is held at a voltage of about 5 Volts.

Under these bias conditions, a high voltage drop of about 9 Volts exists across the gate dielectric layer of NMOS programming transistor 930 of memory cell 900 (wherein the voltage on the floating gate 216 is high). As a result, electrons tunnel from the programming line P0 onto the floating gate electrode 216 of memory cell 900, thereby making threshold voltages of the PMOS access transistor 910, less negative. Memory cells 1000 and 1100 have substantially smaller voltages across their respective gate dielectric layers and thus do not exhibit carrier tunneling. Memory cell 1200 experiences no disturb at all during the programming operation.

FIG. 13B displays a table 1302 that defines a biasing scheme for an erase mode, wherein memory cells 900, 1000, 1100 and 1200 are simultaneously erased. In the erase mode, word lines WL0 and WL1 are held at a voltage of about −5 Volts and programming lines P0 and P1 are held at a voltage of about 5 Volts. Bit lines BL0 and BL1 are coupled to receive the ground supply voltage (0 Volts), or are left floating. N-well regions 902 and 1002 and p-type substrate are coupled to receive the ground supply voltage. Under these bias conditions, there is a voltage drop of about 9 Volts across the gate dielectric layers of programming transistors 910, 1010, 1110 and 1210, with the floating gate electrodes having a relatively low voltage. This bias scheme causes electrons to tunnel from the floating gate electrodes onto programming lines P0 and P1, thereby causing the threshold voltage $V_{TP}$ of PMOS access transistors 910, 1010, 1110 and 1210 to be more negative.

The read mode defined by table 1103 (FIG. 11C) can be used to read the memory cells programmed and erased in accordance with tables 1301 (FIG. 13A) and 1302 (FIG. 13B).

FIG. 14 is a table 1401 that displays an alternative method of performing an erase operation on the memory array of FIG. 11. In this method, programming is performed the in the manner defined by table 1301 of FIG. 13A, and reading is performed in the manner defined by table 1203 of FIG. 12C. As will become apparent in view of the following description, all voltages used for program, erase and read operations are positive in this embodiment.

In the described embodiment, NMOS programming transistors 930, 1030, 1130 and 1230 of memory cells 900, 1000, 1100 and 1200 are fully under-diffused as described above in conjunction with FIGS. 7 and 8, and exhibit an increased junction breakdown voltage of just above 8 Volts. During the erase mode, 8 Volts is applied to all of the program lines P0 and P1, and the voltage applied to the floating gate electrodes is close to 0 Volts. This causes electrons to tunnel from the floating gate electrodes through the gate dielectric layers of the corresponding NMOS programming transistors to the programming lines P0 and P1, thereby making threshold voltages of the PMOS access transistors 910, 1010, 1110 and 1210 more negative.

Although the present invention has been described in connection with several embodiments, it is understood that the invention described above is capable of various modifications, which would be apparent to one of ordinary skill in the art. Thus, the invention is limited only by the following claims.

We claim:

1. A non-volatile memory cell comprising: a semiconductor substrate; an access transistor located in a first active region of the semiconductor substrate; a control capacitor located in a second active region of the semiconductor substrate, the control capacitor including a diffusion region located in the second active region of the semiconductor substrate; and a programming transistor located in a third active region of the semiconductor substrate, wherein the access transistor, the control capacitor and the programming transistor share a common floating gate electrode, and wherein the programming transistor includes a source region having a lightly doped extension region and a drain region having a lightly doped extension region, wherein the source region is electrically connected to the drain region.

2. The non-volatile memory cell of claim 1, further comprising a gate dielectric layer located between the common floating gate electrode and the semiconductor substrate.

3. The non-volatile memory cell of claim 1, further comprising one and only one conductive gate layer located over the semiconductor substrate, wherein the conductive gate layer includes the common floating gate electrode.

4. The non-volatile memory cell of claim 1, wherein the first and second active regions have a first conductivity type and the third active region has a second conductivity type, opposite the first conductivity type.

5. The non-volatile memory cell of claim 1, wherein the drain region is continuous with the source region.

6. The non-volatile memory cell of claim 1, wherein a continuous depletion region surrounds the source region and the drain region.

7. The non-volatile memory cell of claim 6, wherein a portion of the continuous depletion region is located between the source region and the drain region at an upper surface of the semiconductor substrate.

8. The non-volatile memory cell of claim 1, wherein the first active region is continuous with the second active region.

9. The non-volatile memory cell of claim 1, wherein the access transistor has source and drain regions which extend under the floating gate electrode a first distance and the diffusion region of the control capacitor extends under the floating gate electrode a second distance, wherein the first distance is less than the second distance.

10. The non-volatile memory cell of claim 1, wherein the access transistor has source and drain regions which extend under the floating gate electrode a first distance and the programming transistor has source and drain regions which extend under the floating gate electrode a second distance, wherein the first distance is less than the second distance.

11. The non-volatile memory cell of claim 1, wherein the access transistor is a p-channel field effect transistor, and the programming transistor is an n-channel field effect device.

12. The non-volatile memory cell of claim 11, wherein the control capacitor is a p-channel field effect device.

13. The non-volatile memory cell of claim 1, wherein the control capacitor is located in an n-type well region and has p-type gate, source, and drain regions.

14. The non-volatile memory cell of claim 13, wherein the programming transistor is located in a p-type well region and has n-type gate, source, and drain regions.

15. The non-volatile memory cell of claim 14, wherein the access transistor is located in the n-type well region and has p-type gate, source, and drain regions.

16. The non-volatile memory cell of claim 1, wherein the source region and drain region of the programming transistor are electrically connected during a write operation.

17. A non-volatile memory system comprising: a set of access transistors fabricated on a chip, each of the access transistors including a first set of source/drain implants of a first conductivity type; a set of programming transistors fabricated on the chip, one of each programming transistor being immediately adjacent to one of each access transistor, wherein each of the programming transistors includes a second set of source/drain implants of the second conductivity type, wherein the each access transistor and each programming transistor share a common floating gate electrode, and wherein each access transistor has source and drain regions which extend under the floating gate electrode a first distance and each programming transistor has source and drain regions which extend under the floating gate electrode a second distance, such that the first distance is less than the second distance.

18. The non-volatile memory system of claim 17, wherein the set of access transistors include a first set of well implants and a first set of threshold voltage adjustment implants and wherein the programming transistors include a second set of well implants, different than the first set of well implants, and a second set of threshold voltage adjustment implants, different than the first set of threshold voltage adjustment implants.

19. A non-volatile memory system comprising:

a first and a second set of transistors fabricated on a chip, each set of transistors having source/drain implants that form a channel having a length that is shortest at a minimum channel length, each of the transistors of the first set including a first set of source/drain implants of a first conductivity type and a first gate dielectric having a first thickness, and having a first minimum channel length;

a second set of transistors fabricated on the chip, each of the transistors of the second set including a second set of source/drain implants of the first conductivity type, wherein the second set of source/drain implants is different than the first set of source/drain implants, and a second gate dielectric having a second thickness, greater than the first thickness, and having a second minimum channel length, greater than the first minimum channel length; and a non-volatile memory cell fabricated on the chip and including a programming transistor having a gate channel length equal to or greater than the first minimum channel length, but less than the second minimum channel length, the programming transistor also including the second gate dielectric, and the second set of source/drain implants.

20. The non-volatile memory system of claim 19, wherein the first set of transistors include a first set of well implants and a first set of threshold voltage adjustment implants and wherein the second set of transistors include a second set of well implants, different than the first set of well implants, and a second set of threshold voltage adjustment implants, different than the first set of threshold voltage adjustment implants.

* * * * *